United States Patent
Kim et al.

(10) Patent No.: US 8,847,294 B2
(45) Date of Patent: Sep. 30, 2014

(54) SUBSTRATE INCLUDING OXIDE THIN FILM TRANSISTOR, METHOD FOR FABRICATING THE SAME, AND DRIVING CIRCUIT FOR LIQUID CRYSTAL DISPLAY DEVICE USING THE SAME

(71) Applicant: LG Display Co., Ltd., Seoul (KR)

(72) Inventors: TaeSang Kim, Anyang (KR); Hun Jeoung, Paju (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/728,757

(22) Filed: Dec. 27, 2012

(65) Prior Publication Data
US 2014/0061653 A1 Mar. 6, 2014

(30) Foreign Application Priority Data
Aug. 31, 2012 (KR) .................. 10-2012-0096532

(51) Int. Cl.
H01L 29/78 (2006.01)
H01L 21/336 (2006.01)
H01L 29/786 (2006.01)
H01L 29/66 (2006.01)

(52) U.S. Cl.
CPC .... H01L 29/78693 (2013.01); H01L 29/66969 (2013.01)
USPC ............. 257/288; 257/43; 257/57; 257/59; 257/E21.409; 257/E21.411; 257/E29.255; 257/E29.273; 438/158; 438/197

(58) Field of Classification Search
CPC .................. H01L 29/78693; H01L 29/66969
USPC .............. 257/43, 57, 59, 288; 438/158, 197
See application file for complete search history.

(56) References Cited

U.S. PATENT DOCUMENTS

2012/0319114 A1* 12/2012 Yamazaki et al. ............ 257/57
2013/0009219 A1* 1/2013 Yamazaki et al. ............ 257/288

FOREIGN PATENT DOCUMENTS

| KR | 10-2011-0062102 A | 6/2011 |
| KR | 10-2011-0086756 A | 7/2011 |
| KR | 10-2011-0125105 A | 11/2011 |
| WO | WO 2010/058746 A1 | 5/2010 |

* cited by examiner

*Primary Examiner* — Dao H Nguyen
(74) *Attorney, Agent, or Firm* — Birch, Stewart, Kolasch & Birch, LLP

(57) ABSTRACT

There are provided a substrate including an oxide TFT having improved initial threshold voltage degradation characteristics included in a driving circuit of a liquid crystal display (LCD) device, a method for fabricating the same, and a driving circuit for an LCD device using the same. The substrate including an oxide thin film transistor (TFT) includes: a base substrate divided into a pixel region and a driving circuit region; and a plurality of TFTs formed on the base substrate, wherein an initial threshold voltage of at least one of the plurality of TFTs formed in the driving circuit region is positive-shifted to have a predetermined level.

6 Claims, 8 Drawing Sheets

SUBSTRATE INCLUDING OXIDE THIN FILM TRANSISTOR, METHOD FOR FABRICATING THE SAME, AND DRIVING CIRCUIT FOR LIQUID CRYSTAL DISPLAY DEVICE USING THE SAME

The present disclosure relates to subject matter contained in priority Korean Application No. 10-2012-0096532, filed on Aug. 31, 2012, which is herein expressly incorporated by reference in its entirety.

BACKGROUND OF THE INVENTION

1. Field of the Invention

The present invention relates to substrate including an oxide thin film transistor, and more particularly, to a substrate including an oxide TFT having improved initial threshold voltage degradation characteristics included in a driving circuit of a liquid crystal display (LCD) device, a method for fabricating the same, and a driving circuit for an LCD device using the same.

2. Description of the Related Art

A TV product has been the greatest application targets in a remarkably growing flat panel display device field. While an LCD has been the mainstream as a TV panel, an organic light emitting diode (OLED) display device, or the like, has also been intensively studied to be applied to a TV.

To meet the requirements, a substrate such as glass, or the like, is required to be increased, a display device having excellent performance without increasing cost, and a thin film transistor (TFT) to be applied as a switching and driving element are required.

An amorphous silicon TFT (a-Si TFT), a representative driving and switching element of a display device, is currently widely used as an element that may be uniformly formed on a large substrate having a size of 2 m at low cost.

However, as display devices tend to be increased in size and have high picture quality, an element is required to have high performance, so an existing a-Si TFT having mobility of 0.5 cm2/Vs level is determined to reach a limitation.

Thus, a technique of fabricating a high performance TFT having mobility higher than that of a-Si TFT is required. Also, the weakest points of a-Si TFT is that, as the a-Si TFT continues to operate, element characteristics thereof continues to be degraded, failing to maintain initial performance thereof.

Thus, currently, research into overcoming the limitation of the a-Si TFT has been conducted, and an oxide semiconductor TFT has been proposed as a typical TFT.

The oxide semiconductor TFT has high mobility relative to the a-Si TFT, so it is more advantageous in implementing a driving circuit for controlling a switching element of a liquid crystal panel provided in an LCD device, as well as the switching element.

FIG. 1 is an equivalent circuit diagram of a gate driving circuit of the related art LCD device, and FIG. 2 is a cross-sectional view illustrating a TFT of the gate driving circuit of FIG. 1.

The gate driving circuit of the related art LCD device includes a plurality of shift registers, and as shown in FIG. 1, the respective shift registers include a plurality of TFTs T1 to T8. In the respective shift registers, the first transistor T1 is diode-connected to be turned on by a start signal Vst to charge a Q node, and a sixth transistor T6 discharges a QB node by the start signal Vst. As the Q node is charged, a fifth transistor T5 is turned on to discharge the QB node. A second transistor T2 charges the QB node with a high potential driving voltage Vdd according to an inverting clock signal CLKB. As the QB node is turned on, a third transistor T3 is turned to discharge the Q node. A fourth transistor T4 is turned on by a reset signal RST to discharge the Q node and charge the QB node. A seventh transistor T7 is electrically connected to one side of the charged Q node and turned on by a high voltage charged in the Q node to allow a non-inverting clock signal CLK to pass therethrough so as to be output as an output signal Out. An eighth transistor T8 is turned on by the charged QB node to induce the clock signal CLK output through the seventh transistor T7 to be dropped to have a low potential.

As the thin film transistor of the shift register having the foregoing structure is implemented as an oxide transistor, performance thereof is anticipated to be enhanced according to high mobility. However, due to the characteristics of the oxide transistor, initial threshold voltages are irregular according to positions, and initial threshold voltages of some TFTs may be negatively shifted. In particular, an off-current level of the third transistor T3 connected to the QB node to which a high level voltage is continuously applied during a most driving time is increased.

Thus, a voltage level of the Q node connected to the third transistor T3 is lowered and a gate voltage of the sixth transistor T6 is lowered, and as a result, an output of the shift register is degraded.

In order to solve the problem, a method of improving defective driving due to negative shift by configuring the third transistor T3 to have a dual gate structure.

FIG. 2 is a view illustrating an example of a TFT having a dual gate structure applied to the related art shift register.

As illustrated, the TFT having a dual gate structure includes a first gate electrode 13 formed on an insulating substrate 10 having a dual gate structure, a first gate insulating layer 15 formed on the entire surface of the insulating substrate 10 including the first gate electrode 13, an active pattern 17 formed on an upper portion of the first gate insulating layer 15 overlapping the first gate electrode 13, an etch stop pattern 18 formed on the active pattern 17, source and drain electrodes 20 formed on the active pattern 17 in both sides of the first gate electrode 13, a protective layer 22 formed on the entire surface of the substrate including the source and drain electrodes 20, and a second gate electrode (or a back gate) formed to correspond to the first gate electrode 13.

In the TFT having a dual gate structure, a channel may be formed by using the second gate electrode 23, so a current flow through a back channel, as well as a current flow through a front channel of a TFT having a general back channel etched (BCE) invert-staggered structure, can be controlled to improve an off-current problem due to differences between the initial threshold voltages (initial Vth).

However, in order to apply the dual gate structure, an additional masking process is required to be added to form the second gate electrode 23, and also, since an additional control signal is required to be applied to the second gate electrode 23, a size of a driving circuit is increased. Thus, in case of the LCD device including the TFT having the dual gate structure, a fabrication process is complicated, an area of a driving circuit is increased, and fabrication cost is increased.

SUMMARY OF THE INVENTION

An aspect of the present invention provides a substrate including an oxide thin film transistor (TFT) stably driven by improving an occurrence of irregular threshold voltages according to positions of TFTs, including an active pattern by using an oxide, on a substrate, a method for fabricating the same, and a driving circuit for an LCD device using the same.

According to an aspect of the present invention, there is provided a substrate including an oxide thin film transistor (TFT), including: a base substrate divided into a pixel region and a driving circuit region; and a plurality of TFTs formed on the base substrate, wherein an initial threshold voltage of at least one of the plurality of TFTs formed in the driving circuit region is positive-shifted to have a predetermined level.

The at least one TFT may include: a gate electrode formed on the substrate; a gate insulating layer formed on the entire surface of the substrate including the gate electrode; an active pattern formed on the gate insulating layer above the gate electrode and made of an oxide semiconductor completely overlapping the gate electrode; an etch stop pattern formed on the active pattern and the gate insulating layer; and source and drain electrodes formed to be spaced apart from one another on the gate insulating layer including the etch stop pattern and the active pattern, and having a larger overlap region with the active pattern than those of other TFTs on the substrate.

The at least one TFT may include: a gate electrode formed on the substrate; a gate insulating layer formed on the entire surface of the substrate including the gate electrode; an active pattern formed on the gate insulating layer above the gate electrode, made of an oxide semiconductor completely overlapping the gate electrode, and having an area larger than those of other TFTs on the substrate; an etch stop pattern formed on the active pattern and the gate insulating layer; and source and drain electrodes formed to be spaced apart from one another on the gate insulating layer including the etch stop pattern and the active pattern.

According to another aspect of the present invention, there is provided a method for fabricating a substrate divided into a pixel region and a driving circuit region including a plurality of thin film transistors (TFTs), wherein at least one of the plurality of TFTs on the driving circuit region is fabricated by forming a gate electrode on a substrate; forming a gate insulating layer on the entire surface of the substrate including the gate electrode; forming an active pattern made of an oxide semiconductor and completely overlapping the gate electrode on the gate insulating layer above the gate electrode; forming an etch stop pattern on the active pattern and the gate insulating layer; and forming a source electrode and a gate electrode on the gate insulating layer including the etch stop pattern and the active pattern such that they are spaced apart from one another and an initial threshold voltage is positive-shifted to have a predetermined level.

An overlap region of the source electrode and the drain electrode with the active pattern may be larger than an overlap region of a source electrode and a drain electrode of a different TFT with an active pattern.

According to another aspect of the present invention, there is provided a method for fabricating a substrate divided into a pixel region and a driving circuit region including a plurality of thin film transistors (TFTs), wherein at least one of the plurality of TFTs on the driving circuit region is fabricated by forming a gate electrode on a substrate; forming a gate insulating layer on the entire surface of the substrate including the gate electrode; forming an active pattern made of an oxide semiconductor and completely overlapping the gate electrode on the gate insulating layer above the gate electrode such that an initial threshold value is positive-shifted to have a predetermined level; forming an etch stop pattern on the active pattern and the gate insulating layer; and forming a source electrode and a gate electrode on the gate insulating layer including the etch stop pattern and the active pattern such that they are spaced apart from one another.

The active pattern may have an area larger than that of an active pattern of a different TFT.

According to another aspect of the present invention, there is provided a driving circuit for a liquid crystal display device formed on a substrate, including: a first transistor charging a first node when diode-connected and turned on by a start signal Vst; a second transistor charging a second node with a high potential driving voltage Vdd according to an inverting clock signal CLKB; a third transistor turned on according to the charging of the second node to discharge the first node; a fourth transistor turned on by a reset signal RST to discharge the first node and allowing the second node to be charged; a fifth transistor turned on according to the charging of the first node to discharge the second node; a sixth transistor discharging the second node; a seventh transistor turned on by the high voltage charged in the first node to allow a non-inverting clock signal CLK to pass therethrough so as to be output as an output signal; and an eighth transistor turned on by the high voltage charged in the second node to induce the output signal to be dropped to have a low potential, wherein an initial threshold voltage of at least one of the first to eighth transistors is positive-shifted to have a predetermined level.

The at least one transistor may be a third transistor.

In the case of the oxide TFT, the method for fabricating the same, and the driving circuit for an LCD device using the same according to embodiments of the present invention, a conventional bottom-gate structure is used as a dual-gate structure of an oxide TFT for a gate driving circuit, wherein an overlap region between the source and drain electrodes and the active pattern or a channel length is adjusted to compensate for a threshold voltage by positive shift to stably drive the oxide TFT.

The foregoing and other objects, features, aspects and advantages of the present invention will become more apparent from the following detailed description of the present invention when taken in conjunction with the accompanying drawings.

DETAILED DESCRIPTION OF THE INVENTION

Hereinafter, a substrate including an oxide thin film transistor (TFT), a method for fabricating the same, and a driving circuit for an LCD device using the same will be described with reference to the accompanying drawings.

Figure 1:
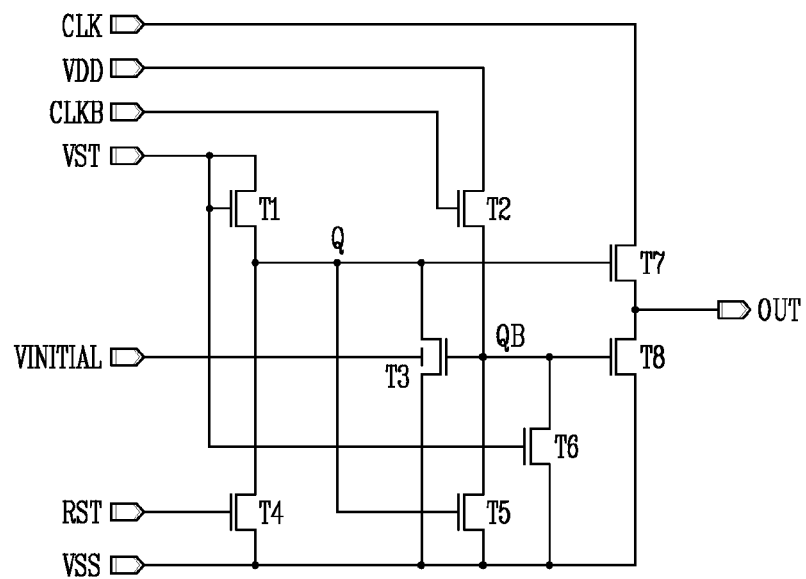
FIG. 1 is an equivalent circuit diagram of a gate driving circuit of the related art LCD device.
Figure 2:
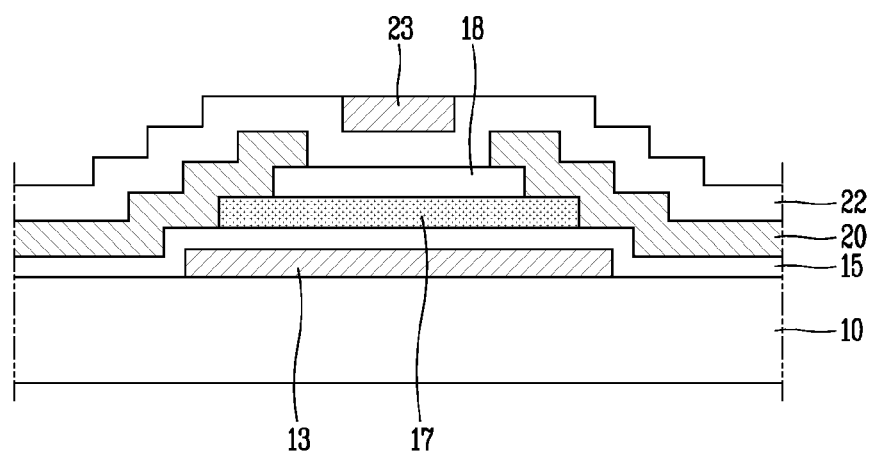
FIG. 2 is a cross-sectional view illustrating a TFT of the gate driving circuit of FIG. 1.
Figure 3:
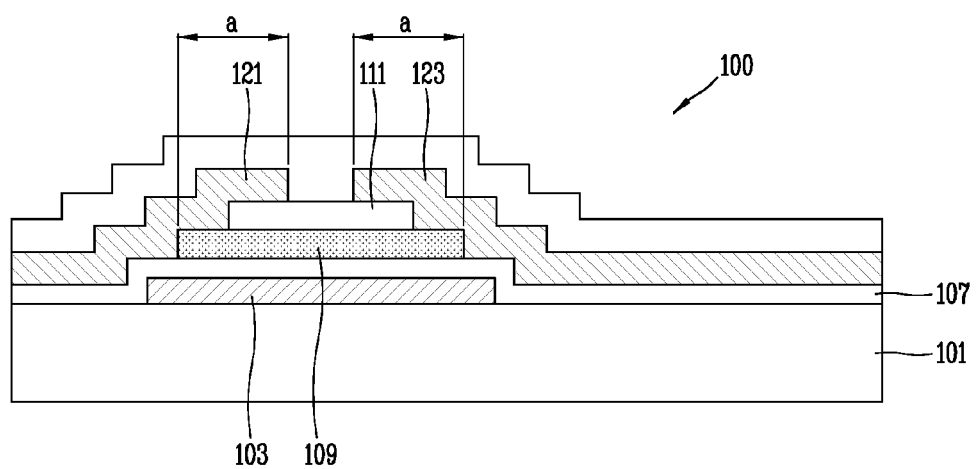
FIG. 3 is a schematic cross-sectional view of an oxide TFT included in a driving circuit for an LCD device according to an embodiment of the present invention.

FIG. 3 is a schematic cross-sectional view of an oxide TFT included in a driving circuit for an LCD device according to an embodiment of the present invention.

Referring to FIG. 3, an oxide TFT according to an embodiment of the present invention includes a gate electrode 103 formed on an insulating substrate 101, a gate insulating layer 107 formed on the entire surface of the insulating substrate including the gate electrode 103, an active pattern 109 formed on the gate insulating layer 107 above the gate electrode 103 and completely overlapping the gate electrode 103, an etch stop pattern 111 formed on the active pattern 109 and the gate insulating layer 107, and a source electrode 121 and a drain electrode 123 formed to be spaced apart from one another on the gate insulating layer 107 including the etch stop pattern 111 and the active pattern 109 and overlapping both sides of the etch stop pattern 111 and the lower active pattern 109.

Here, the gate electrode 103 may be made of a metal or any other appropriate conductive material. For example, a material used to form the gate electrode 103 may include any one selected from a conductive metal group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), a combination of two or more of them, or any other appropriate material.

Also, a material used to form the gate insulating layer 107 covering the gate electrode 103 may include any one selected from the group consisting of silicon oxide ($SiO_2$), silicon nitride (SiNx), zirconium oxide ($ZrO_2$), hafnium oxide ($HfO_2$), titanium oxide ($TiO_2$), tantalum oxide ($Ta_2O_5$), a barium-strontium-titanium-oxygen compound (Ba—Sr—Ti—O), and a bismuth-zinc-niobium-oxygen compound (Bi—Zn—Nb—O), a combination of two or more of them, or any other appropriate material.

The active layer pattern 109 is a semiconductor pattern to form a channel allowing electrons to move therein between the source electrode 121 and the drain electrode 123, which is made of an oxide semiconductor including silicon (Si) instead of an amorphous silicon (a-Si) material.

In this case, the oxide semiconductor may be made of a material obtained by adding silicon (Si) to an oxide semiconductor including one or more selected from the group consisting of germanium (Ge), tin (Sn), lead (Pb), indium (In), titanium (Ti), gallium (Ga), and aluminum (Al), and zinc (Zn). For example, the active pattern 109 may be made of silicon indium zinc oxide (Si—InZnO (SIZO)) and an amorphous indium gallium zinc oxide (a-IGZO)) obtained by adding silicon ions to a composite indium zinc oxide (InZnO). In particular, when the active pattern 109 is formed by using a-IGZO, it may have an advantage in that it has high mobility characteristics, a doping concentration can be easily controlled, and it can be deposited to a large area even at a low temperature.

Also, the etch stop pattern 111 may be made of any one selected from inorganic insulating materials including silicon oxide (SiO2) and silicon nitride (SiNx).

Also, the source electrode 121 and the drain electrode 123 may be made of the same material as that of the gate electrode. A material used to form source electrode 121 and the drain electrode 123 may include any one selected from a conductive metal group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), a combination of two or more of them, or any other appropriate material. Also, the source electrode 121 and the drain electrode 123 may be made of a material obtained by including any other appropriate conductive material in the foregoing metal material.

Here, a line width of the gate electrode 103 may be greater than that of the active pattern 109, and the active pattern 109 may be formed to completely overlap the gate electrode 103.

Also, the etch stop pattern 111 may be formed to overlap the active pattern 109 and the gate electrode 103.

The source electrode 121 and the drain electrode 123 overlap both sides of the etch stop pattern 111 and underlying active pattern 109 and the gate electrode 103, and an upper portion of the active pattern 109 is completely covered by the etch stop pattern 111, the source electrode 121, and the drain electrode 123, and a lower portion thereof is completely covered by the gate electrode 103.

In particular, the source electrode 121 and the drain electrode 123 are formed to cover both upper portions of the etch stop pattern 111. In this case, the source electrode 121 and the drain electrode 123 extend further in an inward direction in comparison to the related art oxide TFT, increasing an overlap region with the active pattern 109.

Namely, a distance between the source electrode 121 and the drain electrode 123 is narrowed and an overlap area with the underlying active pattern 109 is increased, and thus, a threshold voltage is positive-shifted.

In this manner, since the overlap region between the source electrode 121 and the drain electrode 123 and the active pattern 109 is expanded, an initial threshold voltage is positive-shifted to compensate for a threshold voltage of the oxide TFT. Also, in spite of the single gate structure, the same effect as that of the related art dual-gate structure can be obtained.

Hereinafter, a method for fabricating an oxide TFT according to an embodiment of the present invention having the foregoing configuration as described above will be described in detail with reference to the accompanying drawings.

FIGS. 4A to 4H are sectional views illustrating a fabrication process of the oxide TFT according to an embodiment of the present invention.

Figure 4A:
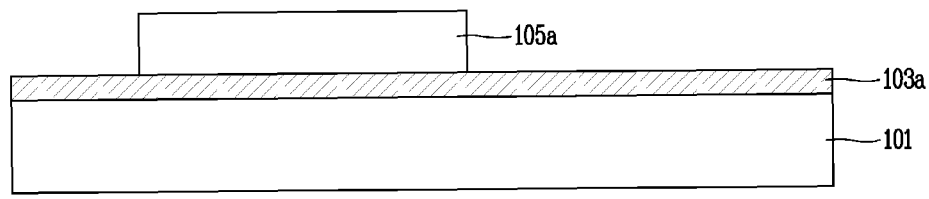
FIGS. 4A to 4H are cross-sectional views illustrating a process of fabricating an oxide TFT according to an embodiment of the present invention.

Referring to FIG. 4A a first conductive material for a gate electrode is deposited on the insulating substrate 101 through a sputtering method to form a first conductive layer 103a, on which a first photosensitive layer (not shown) is coated and patterned through a first masking process using photolithography to form a first photosensitive layer pattern 105a.

In this case, the first conductive layer 103a may be made of a metal or any other appropriate conductive material. For example, a material used to form the first conductive layer 103a may include any one selected from a conductive metal group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), a combination of two or more of them, or any other appropriate material.

Figure 4B:
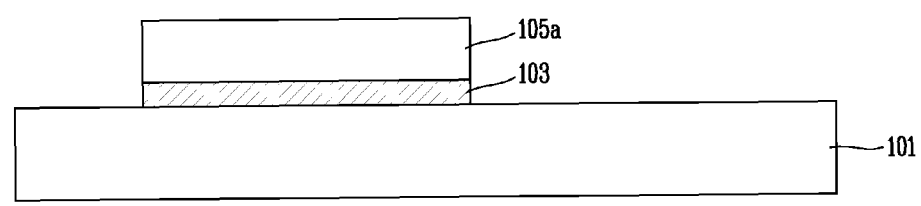

Thereafter, referring to FIG. 4B, the first conductive layer 103a is selectively etched by using the first photosensitive layer pattern 105a as an etch mask to form the gate electrode 103.

Figure 4C:
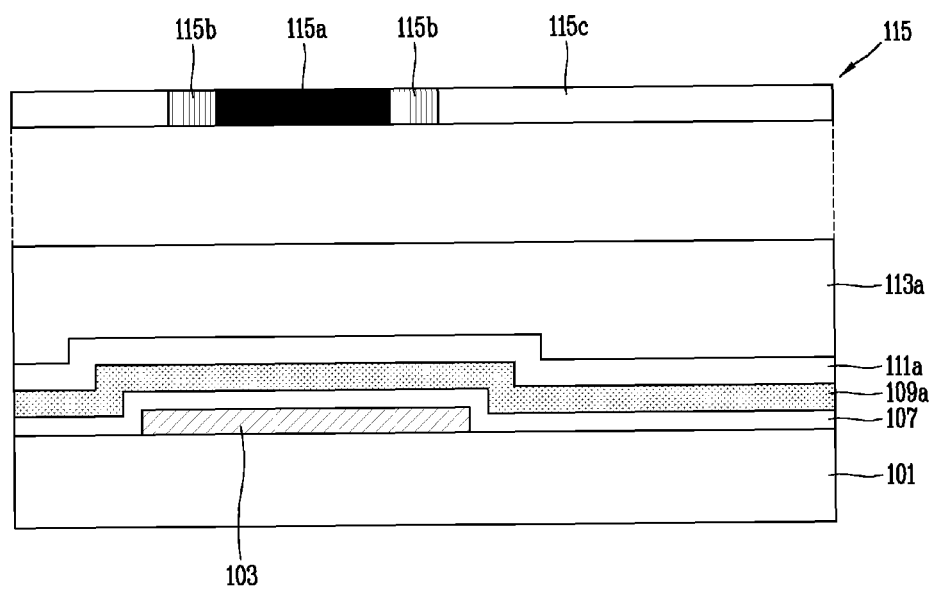

Subsequently, referring to FIG. 4C, the first photosensitive layer pattern 105a is removed, and the gate insulating layer 107 is formed on the entire surface of the substrate including the gate electrode 103. In this case, the gate insulating layer 107 may be made of any one selected from the group consisting of silicon oxide (SiO2), silicon nitride (SiNx), zirconium oxide (ZrO2), hafnium oxide (HfO2), titanium oxide (TiO2), tantalum oxide (Ta2O5), a barium-strontium-titanium-oxygen compound (Ba—Sr—Ti—O), and a bismuth-zinc-niobium-oxygen compound (Bi—Zn—Nb—O), a combination of two or more of them, or any other appropriate material.

Subsequently, an active layer pattern 109a and an etch stop layer 111a are sequentially formed by using an oxide semiconductor material on the gate insulating layer 107, and a second photosensitive layer 113a is coated thereon. Here, the active layer 109s serves to form a channel in which electrons move between the source electrode (not shown) and the drain electrode (not shown), which is made of an oxide semiconductor including silicon (Si) instead of an amorphous silicon (a-Si).

Here, the oxide semiconductor may be obtained by adding silicon (Si) to an oxide semiconductor including one or more selected from the group consisting of germanium (Ge), tin (Sn), lead (Pb), indium (In), titanium (Ti), gallium (Ga), and aluminum (Al), and zinc (Zn). For example, the active layer 109a may be made of silicon indium zinc oxide (Si—InZnO (SIZO)) obtained by adding silicon ions to a composite indium zinc oxide (InZnO) and an amorphous indium gallium zinc oxide (a-IGZO).

Also, the etch stop layer pattern 111a is made of one selected from an inorganic insulating material including a silicon oxide (SiO2) and a silicon nitride (SiNx).

Subsequently, an exposure process is performed through photolithograph using a half-tone mask 115. Here, the half-tone mask 115 includes first and second light blocking regions 115a and 115bn and a light transmission region 15c. The first light blocking region 115a serves to block entire incident light, and the second light blocking region 115b allows a portion of light to be transmitted therethrough and blocking the other remaining portion of light. Also, the light transmission region 115c serves to allow incident light to be entirely transmitted.

Figure 4D:
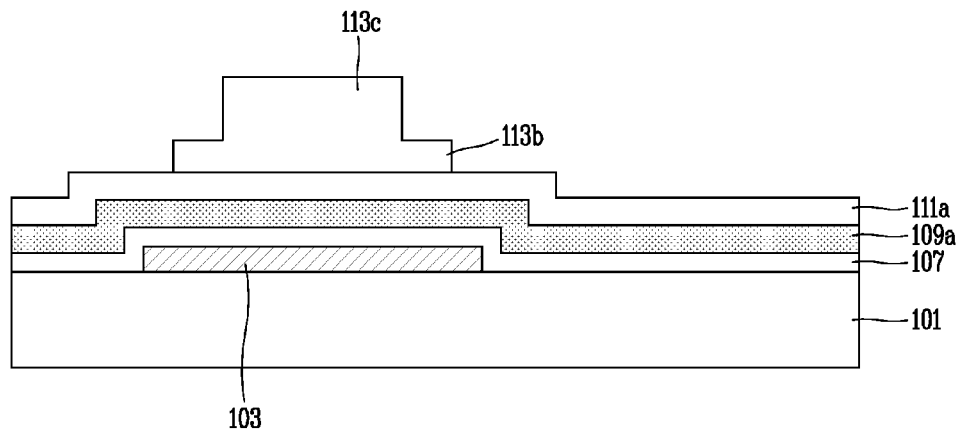

Thereafter, referring to FIG. 4D, the second photosensitive layer 113 part through which light was transmitted through the expose process is removed through a developing process to form second photosensitive layer patterns 113b and 113c having different thicknesses.

Figure 4E:
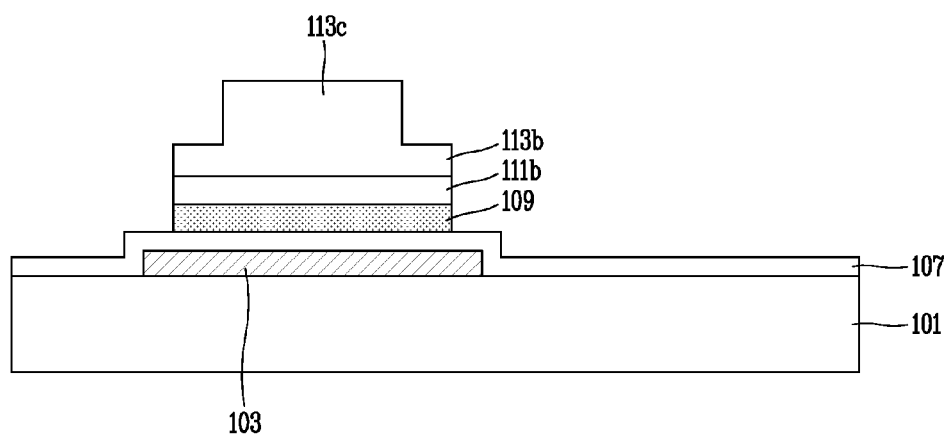

Subsequently, as illustrated in FIG. 4E, the etch stop layer 111a and the active layer 109a are selectively removed by using the second photosensitive layer patterns 113b and 113c as an etch mask to form the active pattern 109 and a partial etch stop layer 111b on the gate insulating layer 107 above the gate electrode 103. Here, the active pattern 109 has a line width smaller than that of the lower gate electrode 103 and is completely overlapped by the gate electrode 103. This structure is advantageous in that the active layer pattern 109 is prevented from being directly exposed to light made incident from a lower side of the insulating substrate 101 by the gate electrode 103.

Figure 4F:
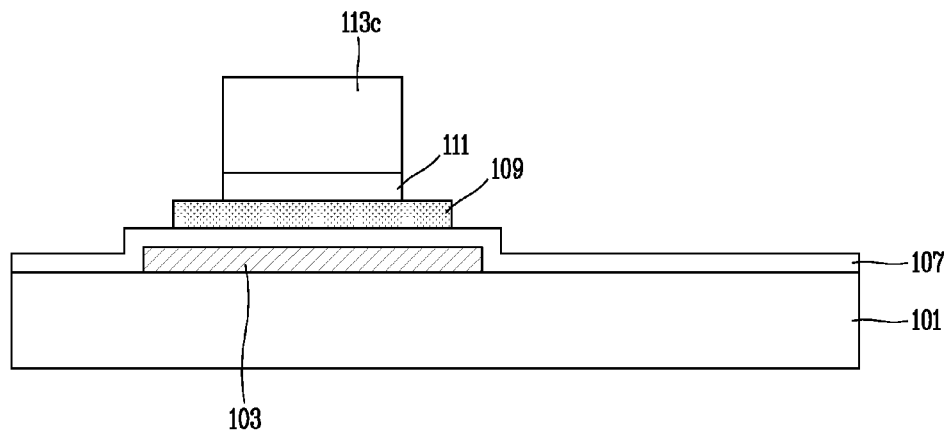

Thereafter, referring to FIG. 4F, an ashing process is performed to completely remove the second photosensitive layer pattern 113b of a portion having a smaller thickness, among the remaining second photosensitive layer patterns 113b and 113c. according to the ashing process, a portion of the second photosensitive layer pattern 113c having a large thickness, as well as the portion having a small thickness, is also removed together. Also, since the second photosensitive layer pattern 113b having a small thickness is completely removed, an outer portion of the lower etch stop layer 111b is exposed to the outside.

Thereafter, the exposed portion of the etch stop layer 111b is selectively etched by using the second photosensitive layer pattern 113c as an etch mask to form the etch stop pattern 111.

Figure 4G:
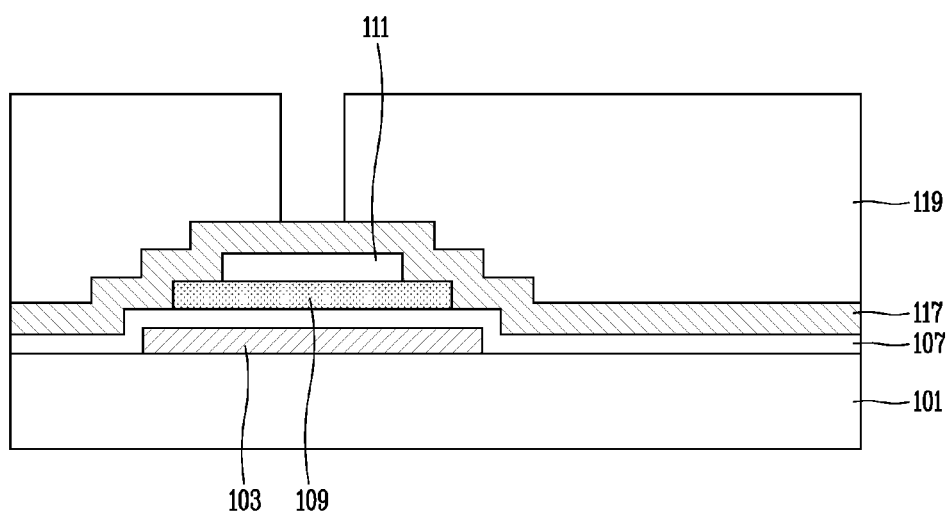

Subsequently, referring to FIG. 4G, after the second photosensitive layer pattern 113c is completely removed, a second conductive layer 117 is deposited on the entire surface of the substrate 101 including the etch layer pattern 111 through a sputtering method, and then, a third photosensitive layer (not shown) is coated thereon. Here, like the gate electrode 103, the second conductive layer 117 may be made of a metal or any other appropriate material. For example, a material used to form the second conductive layer 117 may include any one selected from a conductive metal group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), a combination of two or more of them, or any other appropriate material.

Thereafter, a third photosensitive layer (not shown) is patterned through a masking process using a photolithograph process technique to form a third photosensitive layer pattern 119.

Figure 4H:
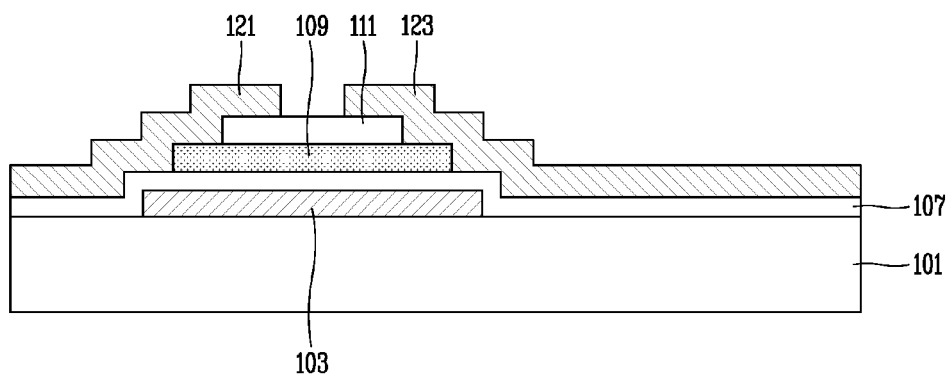

Subsequently, referring to FIG. 4H, the second conductive layer 117 is selectively etched by using the third photosensitive film pattern 119 to form the source electrode 121 and the drain electrode 123, thus completing the fabrication process of the oxide TFT according to an embodiment of the present invention.

Here, the source electrode 121 and the drain electrode 123 overlap both sides of the etch stop pattern 111 and the underlying active layer pattern 109 and the gate electrode 103. In particular, a distance between the source electrode 121 and the drain electrode 123 is narrowed.

Thus, the upper portion of the active layer pattern 109 is mostly covered by the source electrode 121 and the drain electrode 123, and a lower portion of the active layer pattern 109 is completely covered by the gate electrode 103a. Namely, since the distance between the source electrode 121 and the drain electrode 123 is narrowed relative to the related art, regions of the source electrode 121 and the drain electrode 123 overlapping with the lower active pattern 109 are increased.

In this manner, since the overlapping area between the source electrode 121 and the drain electrode 123 and the active pattern 109 is increased, an initial threshold voltage is positive-shifted due to a short-channel effect. Thus, in spite of the single gate structure, the same effect as that of a dual-gate structure can be obtained.

Thus, in the substrate including the oxide TFT fabricated through the fabrication method according to an embodiment of the present invention, an overlap area of the source and drain electrodes with the active pattern is adjusted by increasing an area of the source and drain electrodes, thereby obtaining the same effect as that of a dual-gate structure, simplifying the structure, and reducing production unit cost.

A substrate including an oxide TFT according to another embodiment of the present invention will be described.

Figure 5:
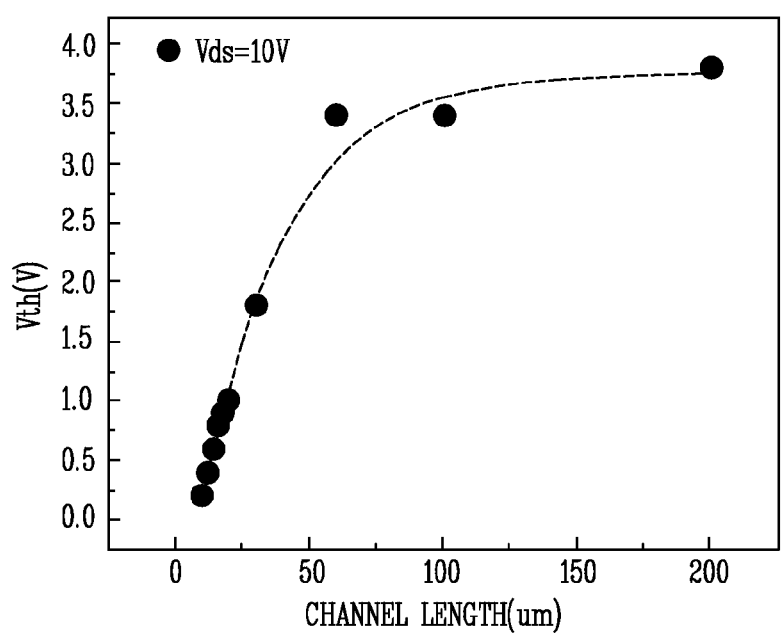
FIG. 5 is a graph showing a relationship between a channel length of an oxide TFT and a threshold voltage.

FIG. 5 is a graph showing a relationship between a channel length of an oxide TFT and a threshold voltage.

Referring to FIG. 5, a threshold voltage of an oxide TFT is changed according to a channel length. In a state that a drain-source voltage Vds is 10V, as the channel length (L) of the TFT is increased, a threshold voltage Vth is increased and starts to be saturated from a point at which a channel length is 100 um or greater.

In particular, a threshold voltage according to a channel length is linearly increased in a section from about 10 um to 20 um. Thus, in the oxide TFT according to the another embodiment of the present invention, the areas of the source and drain are equal to those of the related art and the areas of the active pattern and the upper etch stop pattern are greater than those of a TFT of a different region, whereby a channel length is increased, and thus, an initial threshold voltage is positive-shifted.

Figure 6A:
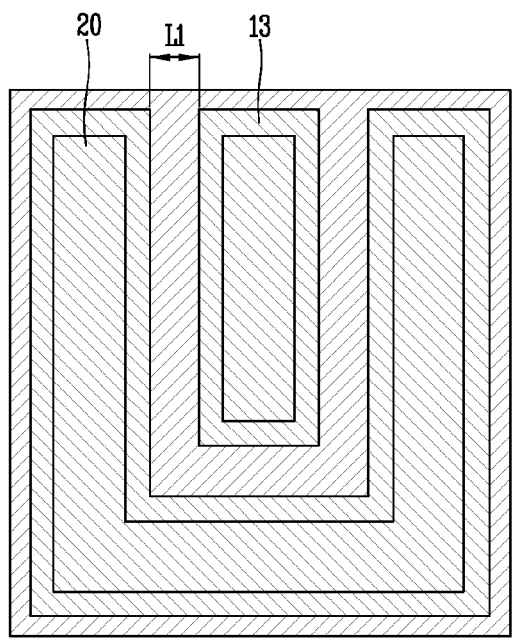
FIG. 6A is a plan view illustrating a channel length of the related art oxide TFT.
Figure 6B:
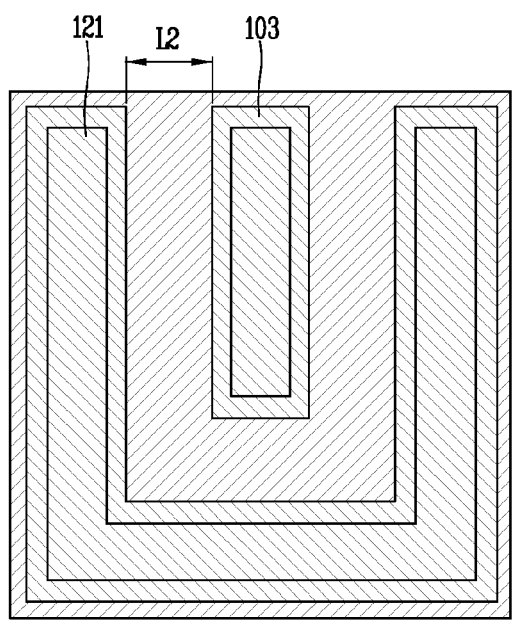
FIG. 6B is a plan view illustrating a channel length of an oxide TFT according to another embodiment of the present invention.

FIG. 6A is a plan view illustrating a channel length of the related art oxide TFT, and FIG. 6B is a plan view illustrating a channel length of an oxide TFT according to another embodiment of the present invention.

Referring to FIGS. 6A and 6B, when a length of a channel formed in the active pattern between the gate electrode 13 and the source and drain electrodes 20 in the related art oxide TFT is L1, in the second embodiment of the present invention, a channel length is increased in the section in which the threshold voltage with respect to a channel length is changed linearly, to positive-shift the oxide TFT to compensate for a threshold voltage. To this end, the area of the source and drain is maintained as is, while the area of the active pattern is increased to lengthen the channel length between the gate electrode 103 and the source and drain 121 to L2.

Figure 7:
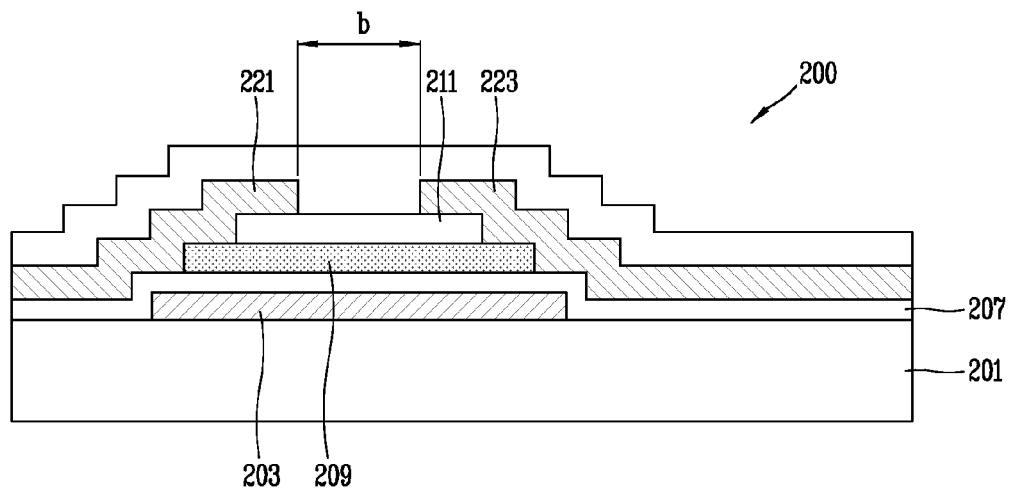
FIG. 7 is a schematic cross-sectional view of one oxide TFT included in a driving circuit for an LCD device according to another embodiment of the present invention.

FIG. 7 is a schematic cross-sectional view of one oxide TFT included in a driving circuit for an LCD device according to another embodiment of the present invention.

Referring to FIG. 7, an oxide TFT 200 according to the present embodiment includes a gate electrode 203 formed on a substrate 201, a gate insulating layer 207 formed on the entire surface of the substrate 201 including the gate electrode 203, an active pattern 209 formed on the gate insulating layer 207 above the gate electrode 203 and completely overlapping the gate electrode 203, an etch stop pattern 211 formed on the active pattern 209 and the gate insulating layer 207, and a source electrode 221 and a drain electrode 223 formed to be spaced apart from one another on the gate insulating layer 207 including the etch stop pattern 211 and the active pattern 209 and overlapping both sides of the etch stop pattern 211 and the lower active pattern 209.

The active pattern 209 is a semiconductor pattern to form a channel allowing electrons to move therein between the source electrode 221 and the drain electrode 223, which is made of an oxide semiconductor including silicon (Si). In particular, an area of the active pattern 209 is larger than that of the related art TFT.

Here, a line width of the gate electrode 203 may be larger than that of the active pattern 209, and the active pattern 209 may be formed to be completely overlapped with the gate electrode 203a.

Also, the etch stop pattern 211 may be formed to overlap with the active pattern 209 and the gate electrode.

The source electrode 221 and the drain electrode 223 may overlap with the both sides of the etch stop pattern 211 and the underlying active pattern 209 and the gate electrode 203. An upper portion of the active pattern 209 is completely covered by the etch stop pattern 211, the source electrode 221, and the drain electrode 223 and a lower portion thereof is completely covered by the gate electrode 203.

In such a structure, the active pattern 209 is formed to be larger than that of the related art TFT, so a distance between the source electrode 221 and the drain electrode 223 is increased (b), and as the channel length is increased, the threshold voltage Vth of the corresponding TFT is positive-shifted.

An example of a driving circuit of an LCD device employing the oxide TFT according to the first and second embodiments of the present invention will be described.

Figure 8:
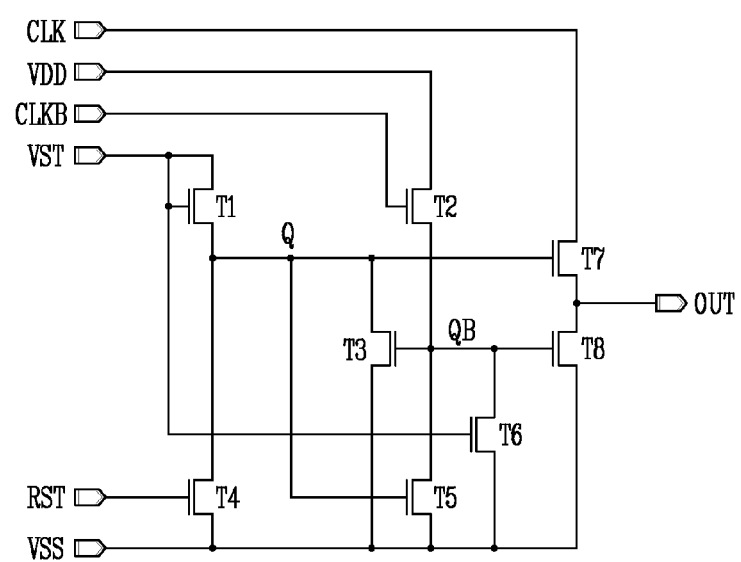
FIG. 8 is an equivalent circuit diagram of a driving circuit for an LCD device employing an oxide TFT according to an embodiment of the present invention.

FIG. 8 is an equivalent circuit diagram of a driving circuit for an LCD device employing an oxide TFT according to an embodiment of the present invention.

A driving circuit for an LCD device having an oxide TFT is a gate driving circuit installed in a liquid crystal panel, rather than in an extra IC, which is included in a plurality of shift registers.

In detail, the driving circuit for a liquid crystal display device formed on a substrate includes: a first transistor charging a first node when diode-connected and turned on by a start signal; a second transistor charging a second node with a high potential driving voltage according to an inverting clock signal; a third transistor turned on according to the charging of the second node to discharge the first node; a fourth transistor turned on by a reset signal to discharge the first node and charging the second node; a fifth transistor turned on according to the charging of the first node to discharge the second node; a sixth transistor discharging the second node; a seventh transistor turned on by a high voltage charged in the first node to allow a non-inverting clock signal as an output signal to pass therethrough; and an eighth transistor turned on by the high voltage charged in the second node to induce the output signal to be dropped to a low potential, wherein an initial threshold voltage of at least one of the first to eighth transistors is positive-shifted to have a predetermined level.

In particular, in the driving circuit for an LCD device according to an embodiment of the present invention, in at least one of the first to eighth transistor T1 to T8, a region in which source and drain electrodes overlap with an active pattern is greater than those of other transistors or has a greater channel length, and in this case, the third transistor T3 turned on according to the charging of the QB node to discharge the Q node may be applied thereto.

Through such a structure, in comparison to the related art, although an initial threshold voltage signal is omitted, an output signal can be stably provided to the liquid crystal panel.

As the present invention may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A substrate divided into a pixel region and a driving circuit region including a plurality of thin film transistors (TFTs) comprising:
    a gate electrode formed on the substrate;
    a gate insulating layer formed on the entire surface of the substrate including the gate electrode;
    an active pattern formed on the gate insulating layer and made of an oxide semiconductor;
    an etch stop pattern formed on the active pattern in an overlapping manner; and
    source and drain electrodes formed to be spaced apart from each other on the gate insulating layer having the etch stop pattern,
    wherein one of the plurality of TFTs on the driving circuit region has a more extended overlap region between the source and drain electrodes and the etch stop pattern than the other TFTs.

2. A driving circuit for a liquid crystal display device formed on a substrate, the driving circuit comprising:
    a first transistor charging a first node when diode-connected and turned on by a start signal;

a second transistor charging a second node with a high potential driving voltage according to an inverting clock signal;

a third transistor turned on according to the charging of the second node to discharge the first node;

a fourth transistor turned on by a reset signal to discharge the first node and allowing the second node to be charged;

a fifth transistor turned on according to the charging of the first node to discharge the second node;

a sixth transistor discharging the second node;

a seventh transistor turned on by the high voltage charged in the first node to allow a non-inverting clock signal to pass therethrough so as to be output as an output signal; and an eighth transistor turned on by the high voltage charged in the second node to induce the output signal to be dropped to have a low potential, wherein an initial threshold voltage of at least one of the first to eighth transistors is positive-shifted to have a predetermined level, and wherein the third transistor has a more extended overlap region between source and drain electrodes and an etch stop pattern than each of the other TFTs.

3. The driving circuit of claim 2, wherein the third transistor has a more extended overlap region with an active pattern and the etch stop pattern than that of each of the first, second, and fourth to eighth transistors.

4. A substrate divided into a pixel region and a driving circuit region including a plurality of thin film transistors (TFTs) comprising:

a gate electrode formed on the substrate;

a gate insulating layer formed on the entire surface of the substrate including the gate electrode;

an active pattern formed on the gate insulating layer and made of an oxide semiconductor;

an etch stop pattern formed on the active pattern in an overlapping manner; and source and drain electrodes formed on the gate insulating layer having the etch stop pattern to be spaced apart from each other, wherein one of the plurality of TFTs has more extended areas of the active pattern and the etch stop pattern than the other TFTs.

5. A method for fabricating a substrate divided into a pixel region and a driving circuit region including a plurality of thin film transistors (TFTs), the method comprising:

forming a gate electrode on a substrate;

forming a gate insulating layer on the entire surface of the substrate including the gate electrode;

forming an active pattern made of an oxide semiconductor on the gate insulating layer above the gate electrode;

forming an etch stop pattern on the active pattern in an overlapping manner; and forming source and drain electrodes to be spaced apart from each other, on the etch stop pattern and the gate insulating layer, wherein one of the plurality of TFTs is formed to have a more extended overlap region between the source and drain electrodes and the etch stop pattern than the other TFTs.

6. A method for fabricating a substrate divided into a pixel region and a driving circuit region including a plurality of thin film transistors (TFTs), the method comprising:

forming a gate electrode on a substrate;

forming a gate insulating layer on the entire surface of the substrate including the gate electrode;

forming an active pattern made of an oxide semiconductor on the gate insulating layer above the gate electrode;

forming an etch stop pattern on the active pattern in an overlapping manner; and forming source and drain electrodes to be spaced apart from each other, on the etch stop pattern and the gate insulating layer, wherein one of the plurality of TFTs has more extended areas of the etch stop pattern and the active pattern than the other TFTs.

* * * * *